United States Patent
Cui et al.

(10) Patent No.: US 11,493,793 B2
(45) Date of Patent: Nov. 8, 2022

(54) DISPLAY PANEL AND METHOD FOR MANUFACTURING SAME, BONDING METHOD, AND DISPLAY DEVICE

(71) Applicant: BOE Technology Group Co., Ltd., Beijing (CN)

(72) Inventors: Qiangwei Cui, Beijing (CN); Lili Wang, Beijing (CN); Ke Meng, Beijing (CN); Chao Liu, Beijing (CN); Chuhang Wang, Beijing (CN); Linhui Gong, Beijing (CN); Zhaohui Li, Beijing (CN); Donghui Wang, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 175 days.

(21) Appl. No.: 16/893,472

(22) Filed: Jun. 5, 2020

(65) Prior Publication Data

US 2021/0088828 A1    Mar. 25, 2021

(30) Foreign Application Priority Data

Sep. 25, 2019   (CN) .......................... 201910910912.5

(51) Int. Cl.
*H01L 23/00*       (2006.01)
*H01L 51/00*       (2006.01)
(Continued)

(52) U.S. Cl.
CPC .. *G02F 1/133305* (2013.01); *G02F 1/133553* (2013.01); *G02F 1/136286* (2013.01);
(Continued)

(58) Field of Classification Search
CPC ......... G02F 1/133305; G02F 1/133553; G02F 1/136286; G02F 1/1303; H01L 24/85; H01L 27/3276; H01L 51/0097; H01L 2227/323; H01L 51/0024; H01L 27/3262; H01L 2224/85203; H01L 2224/85214; Y02E 10/549; Y02P 70/50
See application file for complete search history.

(56) References Cited

U.S. PATENT DOCUMENTS

| | | | |
|---|---|---|---|
| 9,607,960 B1 * | 3/2017 | Peng | ................ H01L 24/05 |
| 2019/0129472 A1 | 5/2019 | Luo et al. | |
| 2019/0206818 A1 | 7/2019 | Liu et al. | |

FOREIGN PATENT DOCUMENTS

| | | |
|---|---|---|
| CN | 103474588 A | 12/2013 |
| CN | 107658320 A | 2/2018 |
| CN | 208271949 U | 12/2018 |

OTHER PUBLICATIONS

First office action of Chinese application No. 201910910912.5 dated Jun. 17, 2021.

* cited by examiner

*Primary Examiner* — Kyoung Lee
(74) *Attorney, Agent, or Firm* — Fay Sharpe LLP

(57) ABSTRACT

The present disclosure discloses a display panel and a method for manufacturing the same, a bonding method, and a display device. The display panel is provided with a bonding area and includes a bonding structure in the bonding area, and the bonding structure is provided with a through hole penetrating along a thickness direction of the bonding structure. The present disclosure helps to improve the bonding efficiency between the display panel and a flexible printed circuit.

18 Claims, 7 Drawing Sheets

(51) Int. Cl.
    *G02F 1/1333*     (2006.01)
    *G02F 1/1335*     (2006.01)
    *G02F 1/1362*     (2006.01)
    *H01L 27/32*     (2006.01)

(52) U.S. Cl.
    CPC .......... *H01L 24/85* (2013.01); *H01L 27/3276* (2013.01); *H01L 51/0097* (2013.01); *H01L 2227/323* (2013.01)

DISPLAY PANEL AND METHOD FOR MANUFACTURING SAME, BONDING METHOD, AND DISPLAY DEVICE

The present disclosure claims priority to Chinese Patent Application No. 201910910912.5, filed on Sep. 25, 2019 and entitled "DISPLAY PANEL AND METHOD FOR MANUFACTURING SAME, BONDING METHOD, AND DISPLAY DEVICE", the entire contents of which are incorporated herein by reference.

TECHNICAL FIELD

The present disclosure relates a display panel and a method for manufacturing same, a bonding method, and a display device.

BACKGROUND

A display device generally includes a display panel and a flexible printed circuit (FPC). In the process of manufacturing the display device, the display panel is typically bonded to the FPC. Both the display panel and the FPC are provided with a bonding area. The bonding area of the display panel is provided with a plurality of bonding structures, and the bonding area of the FPC is provided with a plurality of pins. The bonding herein refers to electrically connecting the bonding structures of the display panel to the pins of the FPC in a one-to-one correspondence.

SUMMARY

The present disclosure provides a display panel and a method for manufacturing same, a bonding method, and a display device. The technical solutions of the present disclosure are as follows:

In one aspect, a display panel is provided. The display panel is provided with a bonding area and includes a bonding structure in the bonding area, wherein the bonding structure is provided with a through hole penetrating along a thickness direction of the bonding structure.

Optionally, the bonding structure is provided with a plurality of uniformly distributed through holes.

Optionally, a ratio of a size of an opening surface of the through hole to a width of the bonding structure ranges from ⅓ to ½, and a hole pitch of any two adjacent through holes in the plurality of through holes ranges from 95 to 105 microns.

Optionally, the opening surface of the through hole is in a circular or a polygonal shape.

Optionally, the display panel further includes: a base substrate; and a reflecting structure disposed on the base substrate, wherein the bonding structure is disposed on a side of the reflecting structure distal from the base substrate, and the reflecting structure is provided with a through hole penetrating along a thickness direction of the reflecting structure, an orthographic projection of the through hole of the reflecting structure on the base substrate overlapping an orthographic projection of the through hole of the bonding structure on the base substrate.

Optionally, the orthographic projection of the through hole of the bonding structure on the base substrate coincides with the orthographic projection of the through hole of the reflecting structure on the base substrate.

Optionally, the display panel further includes: an insulating layer disposed between the reflecting structure and the bonding structure, wherein the insulating layer is partially disposed in the through hole of the reflecting structure.

Optionally, the reflecting structure includes a gate trace; and the display panel further includes a gate, a data line, and a source-drain pattern, wherein the gate and the reflecting structure are distributed in a same layer, and the bonding structure, the data line, and the source-drain pattern are distributed in a same layer.

Optionally, the source-drain pattern includes a source and a drain; and the display panel further includes a buffer layer, an active layer, and a gate insulating layer that are sequentially distributed along a direction distal from the base substrate, wherein the active layer, the gate insulating layer, the gate, the source, and the drain constitute a thin film transistor.

Optionally, the bonding structure is provided with a plurality of uniformly distributed through holes; an opening surface of the through hole is in a circular or a polygonal shape; a ratio of a size of the opening surface of the through hole to a width of the bonding structure ranges from ⅓ to ½; and a hole pitch of any two adjacent through holes in the plurality of through holes ranges from 95 to 105 microns;

the display panel further includes: a base substrate, and a reflecting structure and an insulating layer that are disposed between the base substrate and the bonding structure along a direction distal from the base substrate, wherein the reflecting structure is provided with a through hole penetrating along a thickness direction of the reflecting structure, an orthographic projection of the through hole of the bonding structure on the base substrate coincides with an orthographic projection of the through hole of the reflecting structure on the base substrate, and the insulating layer is partially disposed in the through hole of the reflecting structure; and the reflecting structure includes a gate trace; and the display panel further includes: a gate distributed in a same layer as the reflecting structure, a data line and a source-drain pattern that are distributed in a same layer as the bonding structure, and a buffer layer, an active layer and a gate insulating layer that are disposed between the base substrate and the gate along a direction distal from the base substrate, wherein the source-drain pattern includes a source and a drain, and the active layer, the gate insulating layer, the gate, the source, and the drain constitute a thin film transistor.

In another aspect, a method for manufacturing a display panel is provided. The method includes:

providing a base substrate provided with a bonding area;

forming a bonding structure in the bonding area, wherein the bonding structure is provided with a through hole penetrating along a thickness direction of the bonding structure.

Optionally, the bonding structure is provided with a plurality of uniformly distributed through holes.

Optionally, a ratio of a size of an opening surface of the through hole to a width of the bonding structure ranges from ⅓ to ½, and a hole pitch of any two adjacent through holes in the plurality of through holes ranges from 95 to 105 microns.

Optionally, prior to forming the bonding structure in the bonding area, the method further includes:

forming a reflecting structure on the base substrate, wherein the reflecting structure is provided with a through hole penetrating along a thickness direction of the reflecting structure; and forming the bonding structure in the bonding area includes:

forming the bonding structure on a side of the reflecting structure in the bonding area distal from the base substrate, wherein an orthographic projection of the through hole of the bonding structure on the base substrate overlaps an orthographic projection of the through hole of the reflecting structure on the base substrate.

Optionally, prior to forming the bonding structure on the side of the reflecting structure in the bonding area distal from the base substrate, the method further includes:

forming an insulating layer on the side of the reflecting structure distal from the base substrate, wherein the insulating layer is partially disposed in the through hole of the reflecting structure; and forming the bonding structure on the side of the reflecting structure in the bonding area distal from the base substrate includes:

forming the bonding structure on a side of the insulating layer in the bonding area distal from the base substrate.

Optionally, the reflecting structure includes a gate trace, and the method further includes:

forming a gate on the base substrate, wherein the gate and the reflecting structure are distributed in a same layer;

after forming the insulating layer on the side of the reflecting structure distal from the base substrate, the method further includes:

forming a data line and a source-drain pattern on the side of the insulating layer distal from the base substrate, wherein the bonding structure, the data line, and the source-drain pattern are distributed in a same layer.

Optionally, prior to forming the gate on the base substrate, the method further includes:

sequentially forming a buffer layer, an active layer, and a gate insulating layer on the base substrate; and forming the gate on the base substrate includes:

forming the gate on a side of the gate insulating layer distal from the base substrate.

In yet another aspect, a bonding method is provided. The method includes:

disposing a flexible printed circuit opposite to a display panel to enable a pin of the flexible printed circuit to be in one-to-one correspondence with a bonding structure of the display panel, wherein a bonding adhesive is provided between the pin and the bonding structure;

irradiating the display panel from a side of the display panel distal from the flexible printed circuit with a laser to enable the laser to pass through a through hole of the bonding structure to heat the bonding adhesive; and applying pressure to at least one of the flexible printed circuit and the display panel to enable the pin of the flexible printed circuit and the bonding structure of the display panel to be bonded by the bonding adhesive.

According to still another aspect, a display device is provided and includes a flexible printed circuit and a display panel according to the abovementioned aspects, wherein the flexible printed circuit and the display panel are bonded by the method according to the yet another aspect.

BRIEF DESCRIPTION OF THE DRAWINGS

In order to describe the technical solutions in the embodiments of the present more clearly, the following briefly introduces the accompanying drawings required for describing the embodiments. Apparently, the accompanying drawings in the following description show merely some embodiments of the present disclosure, and a person of ordinary skill in the art may also derive other drawings from these accompanying drawings without creative efforts.

The accompanying drawings, which are incorporated in and constitute a part of this specification, illustrate embodiments consistent with the present disclosure, and together with the description, serve to explain the principles of the present disclosure.

DETAILED DESCRIPTION

For clearer descriptions of the principles, technical solutions, and advantages in the embodiments of the present disclosure, the present disclosure is described in detail below in combination with the accompanying drawings. Apparently, the described embodiments are merely some embodiments, rather than all embodiments, of the present disclosure. Based on the embodiments of the present disclosure, all other embodiments derived by a person of ordinary skill in the art without creative efforts shall fall within the protection scope of the present disclosure.

Figure 1:
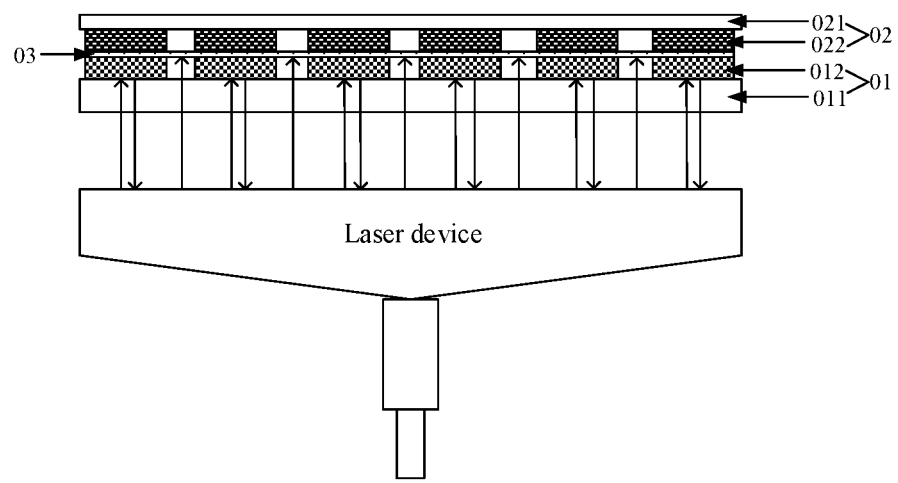
FIG. 1 is a schematic diagram of bonding a display panel to a flexible printed circuit according to an embodiment of the present disclosure.
Figure 2:
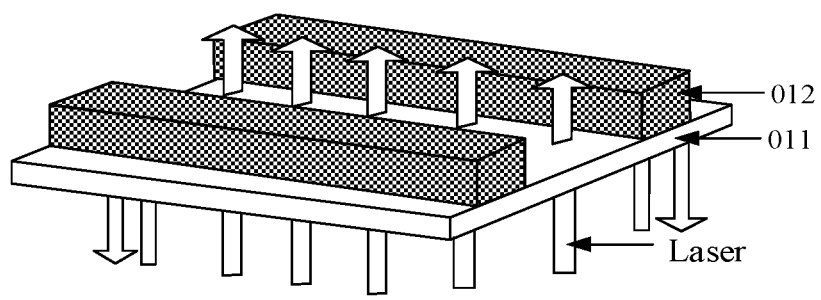
FIG. 2 is an enlarged stereoscopic diagram of a part of the area in FIG. 1.

In the process of manufacturing a display device, it is often necessary to bond the display panel to the flexible printed circuit. FIG. 1 is a schematic diagram of bonding a display panel 01 to a flexible printed circuit 02 according to an embodiment of the present disclosure. FIG. 2 is an enlarged stereoscopic diagram of a part of the area in FIG. 1. Referring to FIG. 1 and FIG. 2, the display panel 01 includes a base substrate 011 and a plurality of bonding structures 012 on the base substrate 011, and the flexible printed circuit 02 includes a carrier film 021 and a plurality of pins 022 on the carrier film 021. When the display panel 01 is bonded to the flexible printed circuit 02, an anisotropic conductive film (ACF) 03 is firstly disposed on a surface of the display panel 01 provided with the bonding structure 012, and then the flexible printed circuit 02 is disposed opposite to the display panel 01, such that the plurality of pins 022 of the flexible printed circuit 02 are contacted to the plurality of bonding structures 012 of the display panel 01 in a one-to-one correspondence by the ACF 03; next, the display panel 01 is irradiated from a side of the display panel 01 distal from the flexible printed circuit 02 with a laser device to enable the laser to pass through the display panel 01 and heat the ACF 03, and meanwhile, pressure is applied to the FPC 02, such that the bonding structures 012 of the display panel 01 are electrically connected to the pins 022 of the flexible printed circuit 02 in a one-to-one correspondence. However, a material of the bonding structure 012 is typically a metal material having a high reflectivity, the laser is easily reflected on the bonding structure 012. Thus, as shown in FIG. 1 and FIG. 2, the laser is only capable pf passing through the area between the adjacent bonding structures 012 and irradiate to the ACF 03 through the display panel 01 and heat the portion of the ACF 03 between the adjacent bonding structures 012. The laser irradiated to the bonding structure 012 is reflected and fails to pass through the display panel 01. Thus, the portion of the ACF 03 corresponding to the bonding structure 012 needs to be heated by heat conduction. However, the heat conduction requires a specified time, and thereby the heating efficiency is low, which causes the bonding efficiency between the display panel and the flexible printed circuit is low. In addition, because the area of the ACF 03 disposed between the adjacent bonding structures 012 is directly heated by the laser, while the area corresponding to the bonding structure 012 is heated by heat conduction, the heating uniformity of the ACF 03 is poor.

Figure 3:
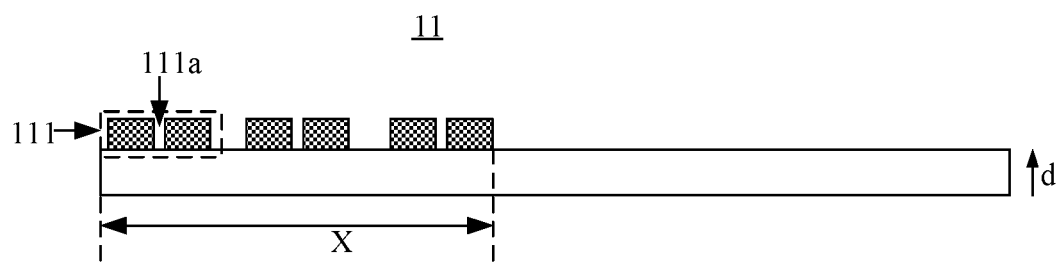
FIG. 3 is a sectional view of a display panel according to an embodiment of the present disclosure.

A reference is made to FIG. 3 that shows a sectional view of a display panel 11 according to an embodiment of the present disclosure. Referring to FIG. 3, the display panel 11 is provided with a bonding area X and includes a bonding structure 111 disposed in the bonding area X. The bonding structure 111 is provided with a through hole 111a penetrating along a thickness direction of the bonding structure 111. The thickness direction of the bonding structure 111 may be parallel to the thickness direction d of the display panel 11. Optionally, as shown in FIG. 3, the display panel 11 includes a plurality of (three shown in FIG. 3) bonding structures 111 in the bonding area X, and each of the bonding structures 111 is provided with a through hole 111a penetrating along the thickness direction of the bonding structure 111.

In summary, for the display panel according to the embodiment of the present disclosure, since the bonding structure in the display panel is provided with a through hole penetrating along the thickness direction of the bonding structure, the laser is capable of passing through the bonding structure via the through hole of the bonding structure when the display panel is bonded to the flexible printed circuit. Thus, the laser is capable of passing through the display panel via the area between the adjacent bonding structures and through holes of the bonding structure, such that more laser is capable of passing through the display panel, which helps to improve the heating efficiency of the laser, and thereby improve the bonding efficiency between the display panel and the flexible printed circuit.

Optionally, each of the bonding structures 111 is provided with a plurality of uniformly distributed through holes 111a, and an opening surface of each of the through holes 111a is in a circular or a polygonal shape. The polygonal shape may be in any polygonal shape such as a triangle, a quadrilateral, a pentagon, or an octagon. Exemplarily, the plurality of through holes 111a of the bonding structure 111 may be arranged in rows and columns in the bonding structure 111, and a distance between any two adjacent through holes 111a in a same row may be equal to a distance between any two adjacent through holes 111a in a same column (that is, the row spacing and the column spacing may be equal). Optionally, the opening surfaces of the through holes 111a in all the bonding structure 111 of a same display panel are in the same shape. For example, the opening surfaces of the through holes 111a in all the bonding structures 111 of the same display panel are in a circular shape. Alternatively, the opening surfaces of the through holes 111a in the same bonding structure 111 are in the same shape, whereas the opening surfaces of the through holes 111a in different bonding structures 111 are in different shapes. For example, for two bonding structures 111 of the same display panel, the opening surfaces of the through holes 111a in one bonding structure 111 are in a circular shape, whereas the opening surfaces of the through holes 111a in the other bonding structure 111 are in a polygonal shape. Alternatively, the opening surfaces of the through holes 111a in the same bonding structure 111 are in different shapes. For example, the opening surfaces of the through holes 111a in the same bonding structure 111 are in circular or polygonal shape, which are not limited in the embodiment of the present disclosure. Exemplarily, a reference is made to FIG. 4 that shows a front view of a bonding structure 111 according to an embodiment of the present disclosure. The bonding structure 111 is provided with a plurality of uniformly distributed through holes 111a, and the opening surface of each of the through holes 111a is in a circular shape.

Figure 4:
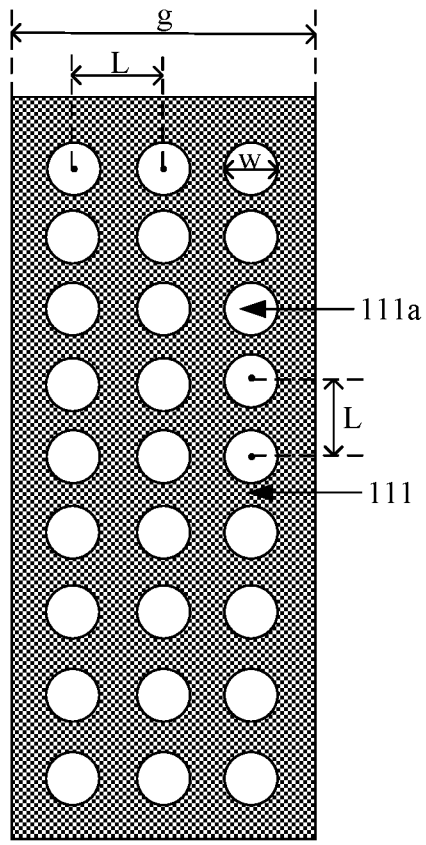
FIG. 4 is a front view of a bonding structure according to an embodiment of the present disclosure.

Optionally, referring to FIG. 4, in the embodiment of the present disclosure, a ratio of a size w of the opening surface of each of the through holes 11a to a width g of the bonding structure 111 ranges from ⅓ to ½, and a hole pitch L of any two adjacent through holes 111a in the plurality of through holes 111a ranges from 95 to 105 microns. The hole pitch refers to the distance between axes of any two adjacent through holes 111a, and the size of the opening surface of the through hole 111a may be the maximum size of the opening surface of the through hole 111a. For example, when the opening surface of the through hole 111a is in a circular shape, the size of the opening surface of the through hole 111a may be a diameter of the opening surface of the through hole 111a; and when the opening surface of the through hole 111a is in a polygonal shape, the size of the opening surface of the through hole 111a may be a length of the longest side or longest diagonal line of the opening surface of the through hole 111a. Exemplarily, when the width g of the bonding structure 111 is 75 microns, the size w of the opening surface of the through hole 111a may be 25 to 35 microns; and on the bonding structure 111 having a width of 1 mm, the hole pitch L of any two adjacent through holes 111a in the plurality of through holes 111a may be 100 μm.

Figure 5:
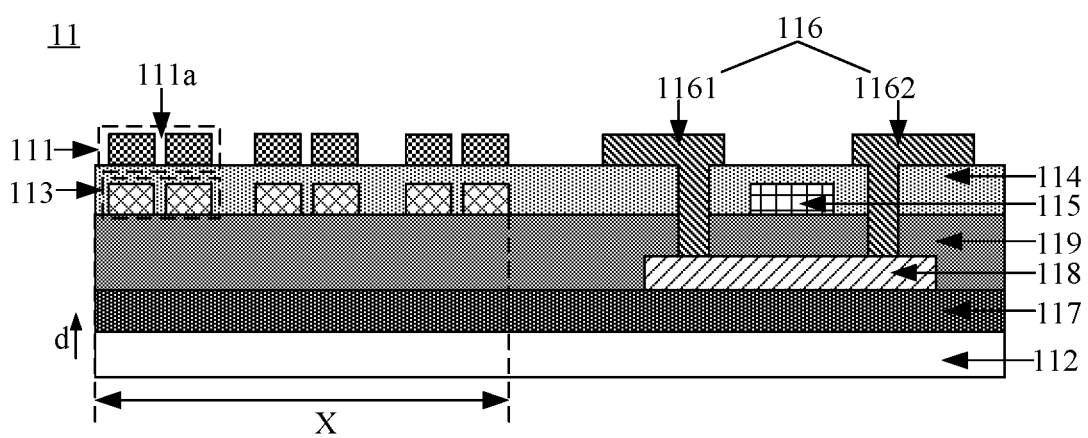
FIG. 5 is a sectional view of another display panel according to an embodiment of the present disclosure.

Optionally, a reference is made to FIG. 5 that shows a sectional view of another display panel according to an embodiment of the present disclosure. Referring to FIG. 5, the display panel 11 further includes: a base substrate 112, and a reflecting structure 113 on the base substrate 112. The bonding structure 111 is disposed on a side of the reflecting structure 113 distal from the base substrate 112, and the reflecting structure 113 is provided with a through hole penetrating along the thickness direction of the reflecting structure 113 (not shown in FIG. 5). The orthographic projection of the through hole of the reflecting structure 113 on the base substrate 112 overlaps the orthographic projection of the through hole 111a of the bonding structure 111 on the base substrate 112. Optionally, as shown in FIG. 5, the display panel 11 includes a plurality of reflecting structures 113, and each of the reflecting structures 113 is provided with a through hole penetrating along the thickness direction of the reflecting structure 113. The thickness direction of the bonding structure 113 may be parallel to the thickness direction d of the display panel 11. Optionally, the orthographic projection of the through hole 111a of the bonding structure 111 on the base substrate 112 coincides with the orthographic projection of the through hole of the reflecting structure 113 on the base substrate 112. Alternatively, the orthographic projection of the through hole 111a of the bonding structure 111 on the base substrate 112 falls within the orthographic projection of the through hole of the reflecting structure 113 on the base substrate 112. The configuration that the orthographic projection of the through hole of the reflecting structure 113 on the base substrate 112 overlaps the orthographic projection of the through hole 111a of the bonding structure 111 on the base substrate 112 helps to avoid the reflecting structure 113 from reflecting the laser during the process of bonding the display panel 111 to the flexible printed circuit, thereby ensuring that the laser can reach the through hole 111a.

Optionally, with further reference to FIG. 5, the display panel 11 further includes an insulating layer 114 disposed between the reflecting structure 113 and the bonding structure 111, the insulating layer 114 being partially disposed in the through hole of the reflecting structure 113. Both the reflecting structure 113 and the bonding structure 111 are electrically conductive, and the insulating layer 114 helps to ensure that the reflecting structure 113 and the bonding structure 111 are insulated from each other, which prevents electrical signals of the reflecting structure 113 and electrical signals of the bonding structure 111 from interfering with each other.

Optionally, the reflecting structure 113 may include agate trace. With further reference to FIG. 5, the display panel 11 further includes: a gate 115, a data line (not shown in FIG. 5), and a source-drain pattern 116. The source-drain pattern 116 may include a source 1161 and a drain 1162. The gate 115 and the reflecting structure 113 may be distributed in the same layer, electrically connected to each other (not shown in FIG. 5), and manufactured by a same patterning process. The bonding structure 111, the data line, and the source-drain pattern 116 may be distributed in the same layer and electrically connected to each other (not shown in FIG. 5). Optionally, the bonding structure 111 may be a part of the data line, and the bonding structure 111, the data line, and the source-drain pattern 116 may be manufactured by a same patterning process.

Optionally, with further reference to FIG. 5, the display panel 11 may further include: a buffer layer 117, an active layer 118, and a gate insulating layer 119 that are sequentially distributed along a direction distal from the base substrate 112. The insulating layer (including the insulating layer 114 and the gate insulating layer 119) between the active layer 118 and the source-drain pattern 116 is provided with via holes; the source 1161 and the drain 1162 are electrically connected to the active layer 118 through different via holes, respectively; and the active layer 118, the gate insulating layer 119, the gate 115, the source 1161, and the drain 1162 constitute a thin film transistor. Optionally, the thin film transistor shown in FIG. 5 may be a top-gate thin film transistor. Those skilled in the art may easily understand that the thin film transistor may also be a bottom-gate thin film transistor, which is not limited in the embodiments of the present disclosure.

Optionally, in the embodiment of the present disclosure, the materials of the bonding structure 111, the source 1161, and the drain 1162 may all be metal materials and may be the same. For example, the materials of the bonding structure 111, the source 1161, and the drain 1162 may be metal copper (Cu) or an alloy containing the metal Cu, and the alloy containing the metal Cu may be, for example, an alloy of metal Cu and metal silver (Ag). The base substrate 112 may be a rigid substrate manufactured by a light-guiding and non-metallic transparent material such as glass or quartz that has a specified ruggedness, or the base substrate 112 may be a flexible substrate manufactured by a flexible material such as polyimide (PI). The materials of the reflecting structure 113 and the gate 115 may both be one of the metal Cu, metal molybdenum (Mo) or metal aluminum (Al). Alternatively, the materials of the reflecting structure 113 and the gate 115 may both be an alloy of more than one of the metal Cu, metal Mo or metal Al, and the materials of the reflecting structure 113 and the gate 115 may be the same. For example, the materials of the reflecting structure 113 and the gate 115 may both be metal Cu; the materials of the insulating layer 114, the buffer layer 117, and the gate insulating layer 119 may all be one or a combination of $SiO_x$, $SiN_x$, or $SiO_xN_x$; and the materials of the active layer 118 may be amorphous silicon (a-Si), polycrystalline silicon (p-Si), indium gallium zinc oxide (IGZO), indium tin zinc oxide (ITZO), or the like.

Those skilled in the art can easily understand that the display panel shown in FIG. 5 is only exemplary, and the practical display panel may include more or fewer structures than the display panel shown in FIG. 5. For example, in addition to the structure shown in FIG. 5, the display panel may further include a flat layer, a passivation layer, a pixel electrode, and the like, and the pixel electrode is generally electrically connected to the drain. When the display panel is a liquid crystal display (LCD) panel, the display panel may further include a color film substrate and a liquid crystal layer; and when the display panel is an organic light-emitting diode (OLED) display panel, the pixel electrode may be an anode, and the display panel may further include a light-emitting layer, a cathode, a packaging structure, a cover plate, and the like, which is not repeatedly described in the embodiments of the present disclosure.

In summary, for the display panel according to the embodiment of the present disclosure, since the bonding structure in the display panel is provided with a through hole penetrating along the thickness direction of the bonding structure, the laser is capable of passing through the bonding structure via the through hole of the bonding structure when the display panel is bonded to the flexible printed circuit. Thus, the laser is capable of passing through the display panel via the area between the adjacent bonding structures and through holes of the bonding structure, such that more laser is capable of passing through the display panel, which helps to improve the heating efficiency of the laser, and thereby improve the bonding efficiency between the display panel and the flexible printed circuit.

Figure 6:
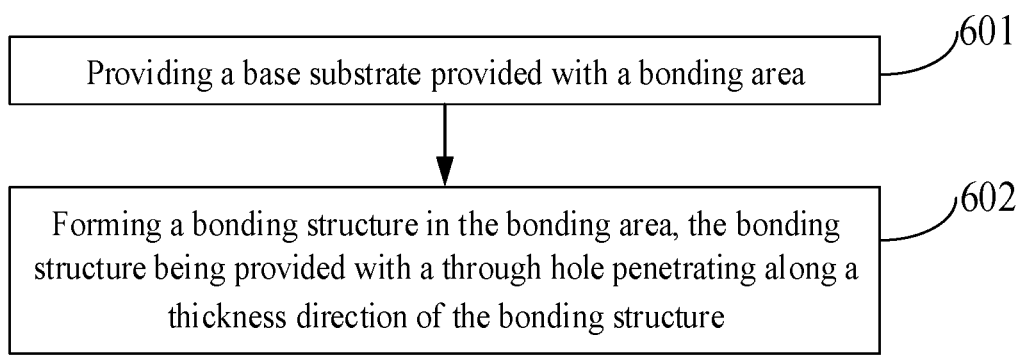
FIG. 6 is a flowchart of a method for manufacturing a display panel according to an embodiment of the present disclosure.

A reference is made to FIG. 6 that shows a flowchart of a method for manufacturing a display panel according to an embodiment of the present disclosure. The method may be applicable for manufacturing the display panel 11 shown in FIG. 3 or FIG. 5. Referring to FIG. 6, the method may include the following steps.

In step 601, abase substrate that is provided with a bonding area is provided.

In step 602, a bonding structure is formed in the bonding area, and the bonding structure is provided with a through hole penetrating along a thickness direction of the bonding structure.

In summary, for the method for manufacturing a display panel according to the embodiment of the present disclosure, as the bonding structure in the display panel manufactured by the method is provided with a through hole penetrating along the thickness direction of the bonding structure, the laser is capable of passing through the bonding structure via the through hole of the bonding structure when the display panel is bonded to the flexible printed circuit. Thus, the laser is capable of passing through the display panel via the area between the adjacent bonding structures and through holes of the bonding structure, such that more laser is capable of passing through the display panel, which helps to improve the heating efficiency of the laser, and thereby improve the bonding efficiency between the display panel and the flexible printed circuit.

Optionally, the bonding structure is provided with a plurality of uniformly distributed through holes.

Optionally, a ratio of a size of an opening surface of the through hole to a width of the bonding structure ranges from ⅓ to ½, and a hole pitch of any two adjacent through holes in the plurality of through holes ranges from 95 to 105 microns.

Optionally, prior to step 602, the method further includes: forming a reflecting structure on the base substrate, wherein the reflecting structure is provided with a through hole penetrating along a thickness direction of the reflecting structure.

Correspondingly, step 602 includes forming the bonding structure on a side of the reflecting structure in the bonding area distal from the base substrate, wherein an orthographic projection of the through hole of the bonding structure on the base substrate overlaps an orthographic projection of the through hole of the reflecting structure on the base substrate.

Optionally, prior to forming the bonding structure on the side of the reflecting structure in the bonding area distal from the base substrate, the method further includes forming an insulating layer on a side of the reflecting structure distal from the base substrate, wherein the insulating layer is partially disposed in the through hole of the reflecting structure.

Forming the bonding structure on the side of the reflecting structure in the bonding area distal from the base substrate includes forming the bonding structure on a side of the insulating layer in the bonding area distal from the base substrate.

Optionally, the reflecting structure includes a gate trace, and the method further includes:

forming a gate on the base substrate, wherein the gate and the reflecting structure are distributed in a same layer.

After forming the insulating layer on the side of the reflecting structure distal from the base substrate, the method further includes:

forming a data line and a source-drain pattern on a side of the insulating layer distal from the base substrate, wherein the bonding structure, the data line, and the source-drain pattern are distributed in a same layer.

Optionally, prior to forming the gate on the base substrate, the method further includes sequentially forming a buffer layer, an active layer and a gate insulating layer on the base substrate.

Correspondingly, forming the gate on the base substrate includes forming the gate on a side of the gate insulating layer distal from the base substrate.

All the aforesaid optional technical solutions may be combined arbitrarily to form optional embodiments of the present disclosure, and are not elaborated here.

Figure 7:
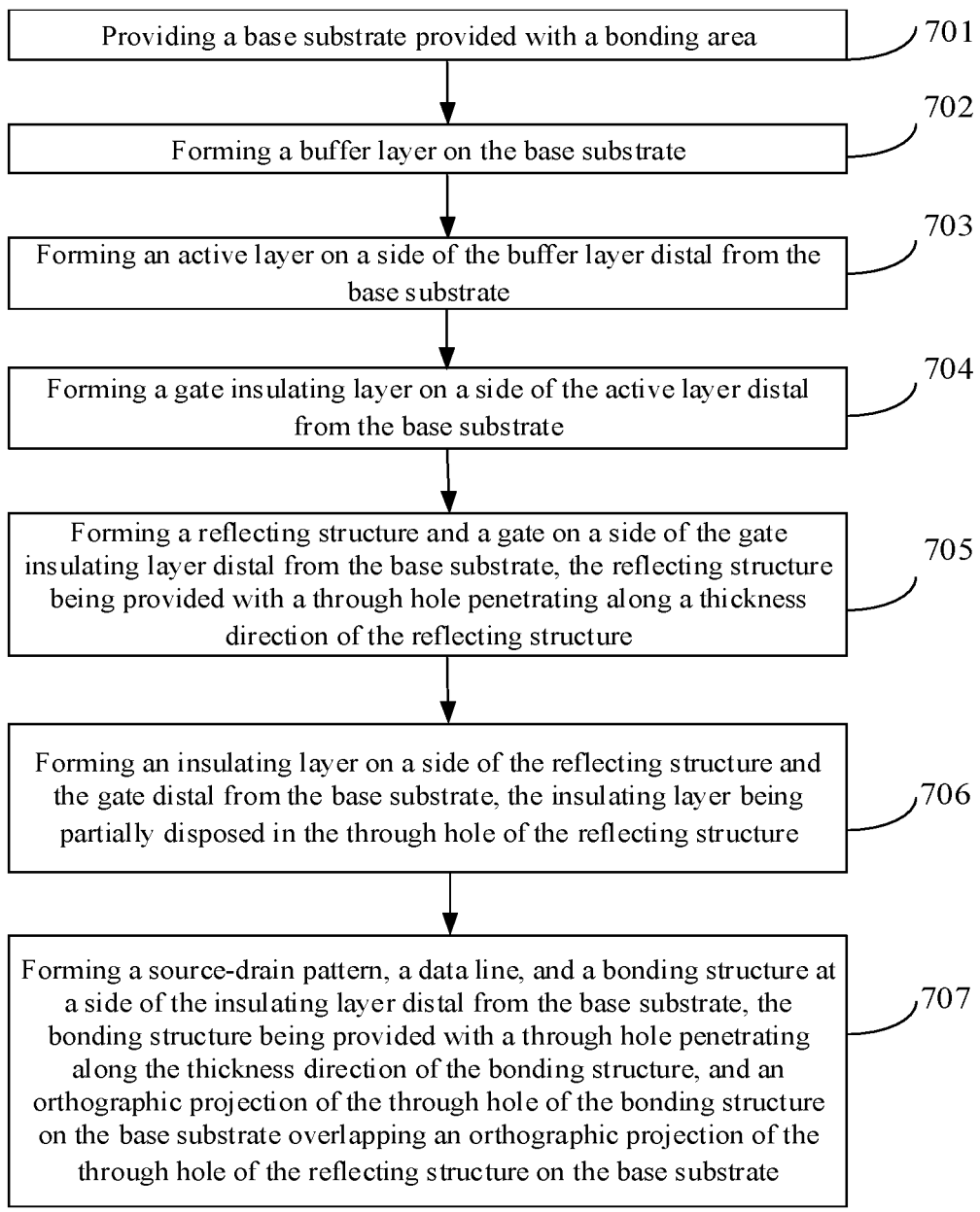
FIG. 7 is a flowchart of another method for manufacturing a display panel according to an embodiment of the present disclosure.

A reference is made to FIG. 7 that shows a flowchart of another method for manufacturing a display panel according to an embodiment of the present disclosure. The method may be applicable for manufacturing the display panel 11 shown in FIG. 3 or FIG. 5. This embodiment is illustrated with the display panel 11 shown in FIG. 5 as an example. Referring to FIG. 7, the method may include following steps.

In step 701, abase substrate that is provided with a bonding area is provided.

The base substrate is provided with a bonding area, and may be a rigid substrate manufactured by a light-guiding and non-metallic transparent material such as glass or quartz that has a specified ruggedness, or the base substrate may be a flexible substrate manufactured by a flexible material such as PI.

In step 702, a buffer layer is formed on the base substrate.

Figure 8:
FIG. 8 is a schematic diagram after forming a buffer layer on abase substrate according to an embodiment of the present disclosure.

A reference is made to FIG. 8 that shows a schematic diagram after forming a buffer layer 117 on the base substrate 112 according to an embodiment of the present disclosure. The buffer layer 117 covers the base substrate 112. Optionally, the material of the buffer layer 117 may be one or a combination of $SiO_x$, $SiN_x$, or $SiO_xN_x$. Exemplarily, the buffer layer 117 is formed on the base substrate 112 by any one of the processes such as deposition, coating, or sputtering with $SiO_x$ as the material.

In step 703, an active layer is formed on a side of the buffer layer distal from the base substrate.

Figure 9:
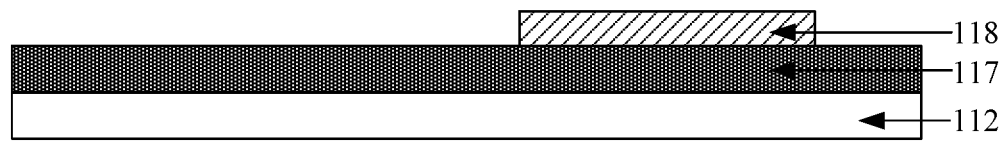
FIG. 9 is a schematic diagram after forming an active layer on a side of a buffer layer distal from a base substrate according to an embodiment of the present disclosure.

A reference is made to FIG. 9 that shows a schematic diagram after forming the active layer 118 on a side of the buffer layer 117 distal from the base substrate 112 according to an embodiment of the present disclosure. Optionally, the material of the active layer 118 may be one or a combination of a-Si, p-Si, IGZO, or ITZO. Exemplarily, the IGZO material layer may be formed on the side of the buffer layer 117 distal from the base substrate 112 by any one of the processes such as deposition, magnetron sputtering, or thermal evaporation; and the active layer 118 may be obtained by processing the IGZO material layer with one patterning process.

In step 704, a gate insulating layer is formed on a side of the active layer distal from the base substrate.

Figure 10:
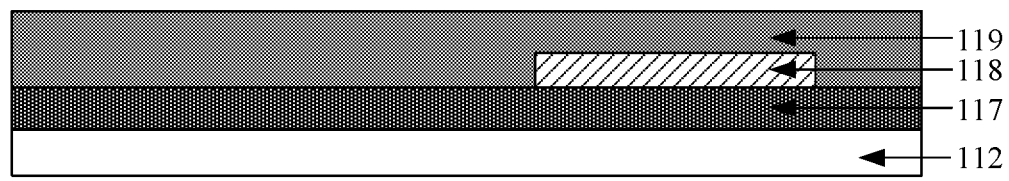
FIG. 10 is a schematic diagram after forming a gate insulating layer on a side of an active layer distal from a base substrate according to an embodiment of the present disclosure.

A reference is made to FIG. 10 that shows a schematic diagram after forming the gate insulating layer 119 on a side of the active layer 118 distal from the base substrate 112 according to an embodiment of the present disclosure. Referring to FIG. 10, the gate insulating layer 119 covers the active layer 118 and the buffer layer 117. Optionally, the material of the gate insulating layer 119 may be one or a combination of $SiO_x$, $SiN_x$, or $SiO_xN_x$. Exemplarily, the gate insulating layer 119 is formed on the base substrate 112 on which the active layer 118 is formed by any one of the processes such as deposition, coating, or sputtering with $SiO_x$ as the material.

In step 705, the reflecting structure and the gate are formed on a side of the gate insulating layer distal from the base substrate, wherein the reflecting structure is provided with a through hole penetrating along a thickness direction of the reflecting structure.

Figure 11:
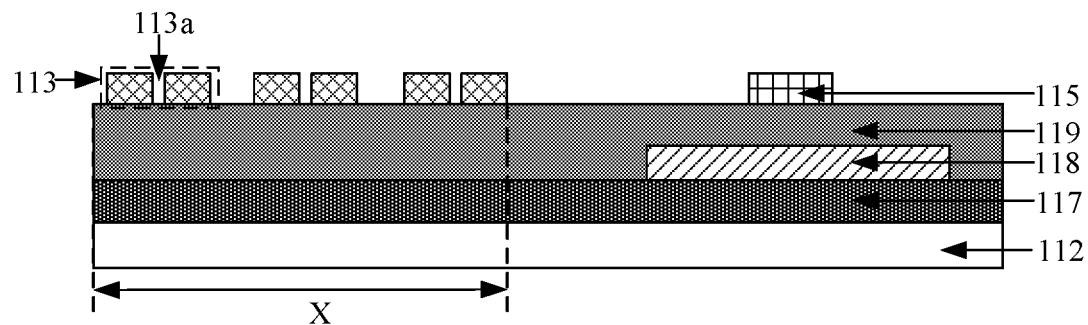
FIG. 11 is a schematic diagram after forming a reflecting structure and a gate on a side of a gate insulating layer distal from a base substrate according to an embodiment of the present disclosure.

A reference is made to FIG. 11 that shows a schematic diagram after forming the reflecting structure 113 and the gate 115 on a side of the gate insulating layer 119 distal from the base substrate 112 according to an embodiment of the present disclosure. The reflecting structure 113 is distributed in the same layer with the gate 115 and may be disposed in the bonding area X. The reflecting structure 113 is provided with a through hole 113a penetrating along the thickness direction of the reflecting structure 113. An orthographic projection of the gate 115 on the base substrate 112 falls within an orthographic projection of the active layer 114 on the base substrate 112. Optionally, the materials of the reflecting structure 113 and the gate 115 may both be one of the metal Cu, metal Mo or metal Al. Alternatively, the materials of the reflecting structure 113 and the gate 115 may both be an alloy of more than one of the metal Cu, metal Mo, or metal Al. Exemplarily, a Cu material layer may be formed on the side of the gate insulating layer 119 distal from the base substrate 112 by any one of the processes such as deposition, magnetron sputtering, or thermal evaporation; and the reflecting structure 113 and active layer 115 may be obtained by processing the Cu material layer with one patterning process.

It should be easily understood that the embodiment of the present disclosure is illustrated by forming the reflecting structure 113 and gate 115 by one process. In practice, the reflecting structure 113 and the gate 115 may be formed separately by two processes, which is not limited in the embodiments of the present disclosure.

In step 706, an insulating layer is formed on a side of the reflecting structure and the gate distal from the base substrate, wherein the insulating layer is partially disposed in the through hole of the reflecting structure.

Figure 12:
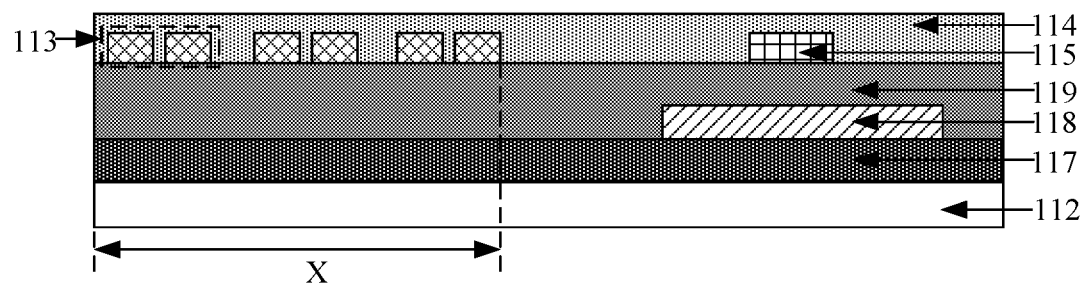
FIG. 12 is a schematic diagram after forming an insulating layer on a side of a reflecting structure and a gate distal from a base substrate according to an embodiment of the present disclosure.

A reference is made to FIG. 12 that shows a schematic diagram after forming the insulating layer 114 on a side of the reflecting structure 113 and the gate 115 distal from the base substrate 112 according to an embodiment of the present disclosure. Referring to FIG. 12 and combining FIG. 11, the insulating layer 114 covers the reflecting structure 113 and the gate 115, and is partially disposed in the through hole 113a. Optionally, the material of the insulating layer 114 may be one or a combination of $SiO_x$, $SiN_x$, or $SiO_xN_x$. Exemplarily, the insulating layer 114 is formed on the side of the reflecting structure 113 and the gate 115 distal from the base substrate 112 by any one of the processes, such as deposition, coating, sputtering, or the like.

In step 707, a source-drain pattern, a data line, and a bonding structure are formed on a side of the insulating layer distal from the base substrate. The bonding structure is provided with a through hole penetrating along the thickness direction of the bonding structure, and an orthographic projection of the through hole of the bonding structure on the base substrate overlaps an orthographic projection of the through hole of the reflecting structure on the base substrate.

The schematic diagram after forming the source-drain pattern 116, the data line, and the bonding structure 111 on the side of the insulating layer 114 distal from the base substrate 112 may be shown in FIG. 5. The bonding structure 111, the data line, and the source-drain pattern 116 are distributed in the same layer, and the bonding structure 111 is disposed in the bonding area X. The bonding structure 111 is provided with a through hole 111a penetrating along the thickness direction of the bonding structure 111, and the orthographic projection of the through hole 111a of the bonding structure 111 on the base substrate 112 overlaps the orthographic projection of the through hole 113a of the reflecting structure 113 on the base substrate 112. For example, the orthographic projection of the through hole 111a on the base substrate 112 falls within the orthographic projection of the through hole 113a on the base substrate 112; or the orthographic projection of the through hole 111a on the base substrate 112 coincides with the orthographic projection of the through hole 113a on the base substrate 112. Optionally, the materials of the source-drain pattern 116, the data line and the bonding structure 111 may all be metal Cu or an alloy containing metal Cu. Exemplarily, the Cu material layer may be formed on the side of the insulating layer 114 distal from the base substrate 112 by any one of the processes such as deposition, magnetron sputtering, or thermal evaporation; and the source-drain pattern 116, the data line, and the bonding structure 111 may be obtained by processing the Cu material layer with one patterning process.

It should be easily understood that the embodiment of the present disclosure is illustrated by forming the source-drain pattern 116, the data line, and the bonding structure 111 by one process as an example. In practice, the source-drain pattern 116, the data line, and the bonding structure 111 may be formed separately by more than one process, which is not limited in the embodiment of the present disclosure.

In the embodiment of the present disclosure, one patterning process may include: photoresist coating, exposure, development, etching, and photoresist stripping. Thus, processing the material layer (such as, the metal Cu material layer) by one patterning process to obtain a corresponding structure includes: firstly, coating a layer of photoresist on the material layer (such as, the metal Cu material layer) to form a photoresist layer, and exposing the photoresist layer with a mask, thereby causing the photoresist layer to form a fully exposed area and a non-exposed area; then, processing the exposed photoresist layer by the development process to completely remove the photoresist in the fully exposed area and completely retain the photoresist in the non-exposed area; afterwards, etching the area corresponding to the fully exposed area on the material layer (such as, the metal Cu material layer) by an etching process; and finally, stripping the photoresist in the non-exposure area, such that a corresponding structure (such as, the reflecting structure 113 and the gate 115) is formed on the area corresponding to the non-exposed area of the material layer (such as, the metal Cu material layer). It is easy to understand that the embodiment of the present disclosure takes a positive photoresist as an example to illustrate the one patterning process. The photoresist adopted in the one patterning process may be a negative photoresist, which is not repeatedly described in the embodiments of the present disclosure.

In summary, for the method for manufacturing a display panel according to the embodiment of the present disclosure, as the bonding structure in the display panel manufactured by the method is provided with a through hole penetrating along the thickness direction of the bonding structure, the laser is capable of passing through the bonding structure via the through hole of the bonding structure when the display panel is bonded to the flexible printed circuit. Thus, the laser is capable of passing through the display panel via the area between the adjacent bonding structures and through holes of the bonding structure, such that more laser is capable of passing through the display panel, which helps to improve the heating efficiency of the laser, and thereby improve the bonding efficiency between the display panel and the flexible printed circuit.

Figure 13:
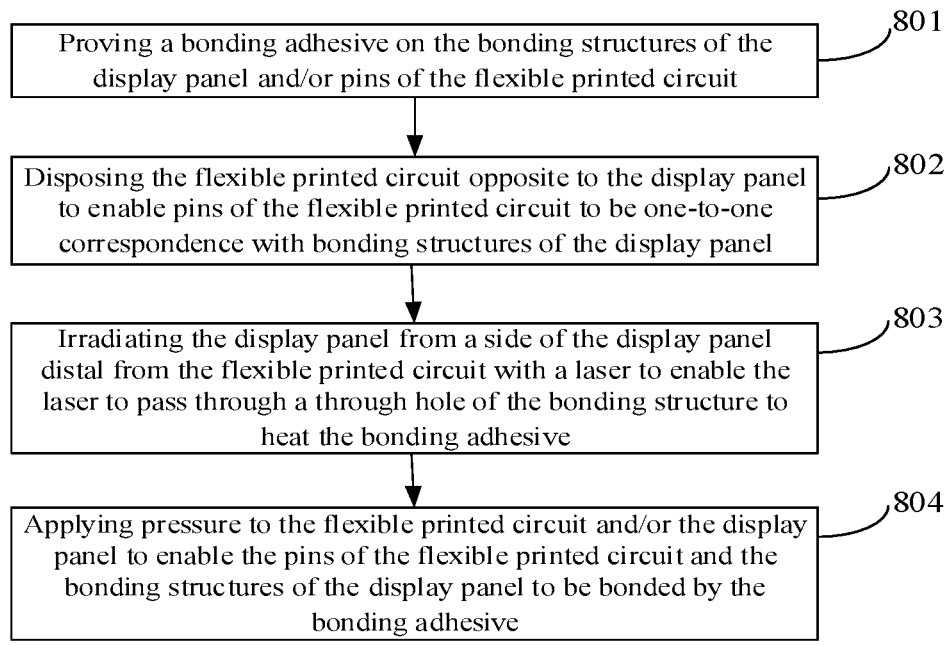
FIG. 13 is a flowchart of a bonding method according to an embodiment of the present disclosure.

A reference is made to FIG. 13 that shows a flowchart of a bonding method according to an embodiment of the present disclosure. The method may be applicable for bonding the flexible printed circuit to the display panel, and the display panel may be the display panel 11 shown in FIG. 3 or FIG. 5. Referring to FIG. 13, the bonding method may include the following steps.

In step 801, a bonding adhesive is provided on the bonding structures of the display panel and/or pins of the flexible printed circuit.

The bonding adhesive may be ACF that may include a colloidal matrix and conductive balls dispersed in the colloidal matrix. The colloidal matrix may be an insulating resin, and the conductive ball includes a conductive ball core and an insulating layer wrapped around the conductive ball core. When the conductive ball core is exposed due to rupture of the insulating layer, the conductive ball core is dispersed in the colloidal matrix to enable the ACF to be conductive.

Figure 14:
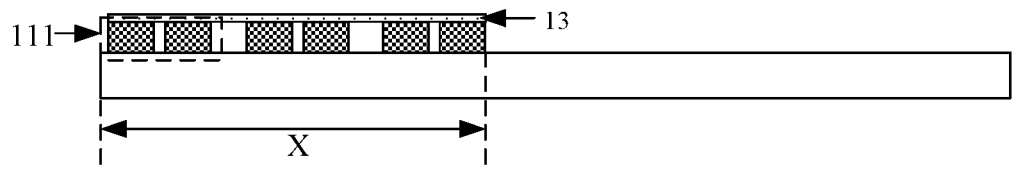
FIG. 14 is a schematic diagram after providing a bonding adhesive on a bonding structure of a display panel according to an embodiment of the present disclosure.

Optionally, the bonding adhesive may be provided on the bonding structures of the display panel, or provided on pins of the flexible printed circuit, or provided on both the bonding structures of the display panel and pins of the flexible printed circuit, which is not limited in the embodiments of the present disclosure. The embodiment of the present disclosure takes providing the bonding adhesive on the bonding structures of the display panel as an example. Exemplarily, a reference is made to FIG. 14 that shows a schematic diagram after providing the bonding adhesive 13 on the bonding structure 111 of the display panel 11 according to an embodiment of the present disclosure. Optionally, the display panel 11 may be disposed on a supporting stage, and then the bonding adhesive 13 is attached to a side of the bonding structure 111 distal from the base substrate 112 with an adhesive application device.

In step 802, the flexible printed circuit is disposed opposite to the display panel to enable a pin of the flexible printed circuit to be in one-to-one correspondence with a bonding structures of the display panel.

Figure 15:
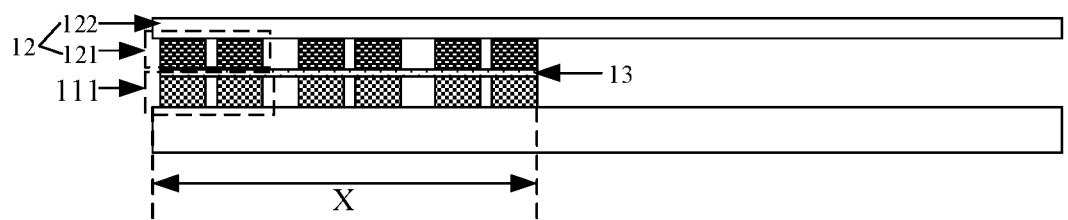
FIG. 15 is a schematic diagram after disposing a flexible printed circuit opposite to a display panel according to an embodiment of the present disclosure.

A reference is made to FIG. 15 that shows a schematic diagram after disposing the flexible printed circuit 12 opposite to the display panel according to an embodiment of the present disclosure. Referring to FIG. 15, the flexible printed circuit 12 includes a carrier substrate 122 and a plurality of pins 121 on the carrying substrate 122. The pins 121 of the flexible printed circuit 12 one-to-one correspond to the bonding structures 111, and the bonding adhesive 13 is disposed between the bonding structures 111 and the pins 121 of the flexible printed circuit 12. Optionally, a manipulator may be adopted to disposing the flexible printed circuit 12 opposite to the display panel 11, such that the pins 121 of the flexible printed circuit 121 one-to-one correspond to the bonding structures 111 of the display panel 11.

In step 803, the display panel is irradiated from a side of the display panel distal from the flexible printed circuit with a laser to enable the laser to pass through a through hole of the bonding structure to heat the bonding adhesive.

Figure 16:
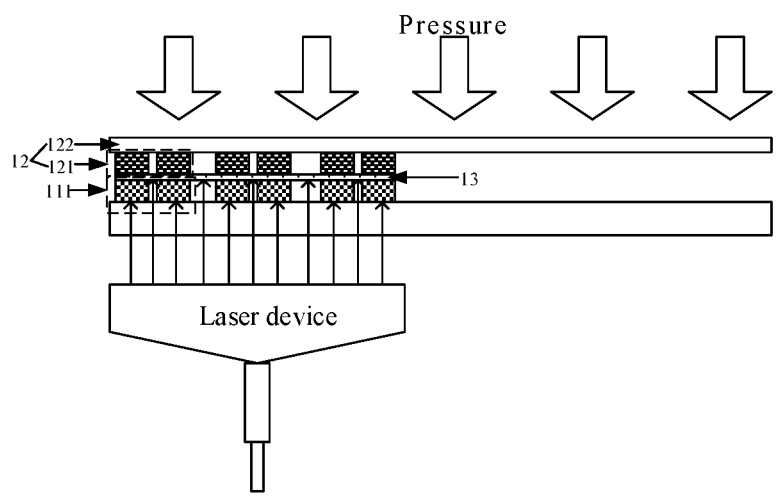
FIG. 16 is a schematic diagram of bonding a flexible printed circuit to a display panel according to an embodiment of the present disclosure.
Figure 17:
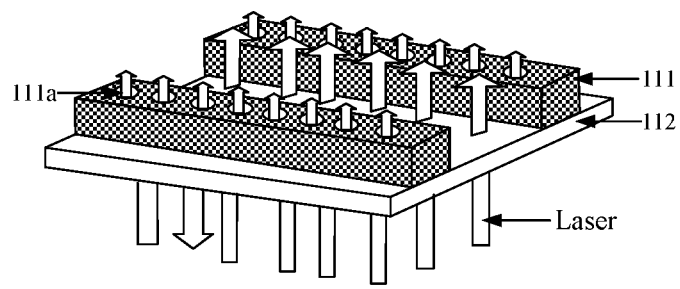
FIG. 17 is an enlarged stereoscopic diagram of a part of the area in FIG. 16.
Figure 18:
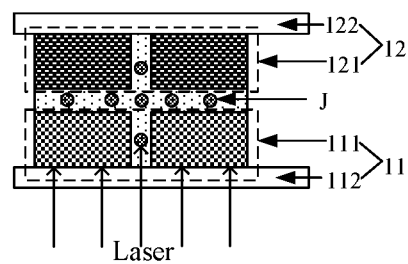
FIG. 18 is an enlarged perspective view of another part of the area in FIG. 16.

FIG. 16 is a schematic diagram of bonding the flexible printed circuit 12 to the display panel 11 according to an embodiment of the present disclosure; FIG. 17 is an enlarged stereoscopic diagram of a part of the area in FIG. 16; and FIG. 18 is an enlarged perspective view of another part of the area in FIG. 16. Referring to FIG. 16 to FIG. 18, the laser device may be disposed on a side of the display panel 11 distal from the flexible printed circuit 12, such that the laser emitted from the laser device irradiates the display panel 11 from the side of the display panel 11 distal from the flexible printed circuit 12, and passes through the area between adjacent bonding structures 111 and the through hole 111a of the bonding structure to irradiate and thereby heat the bonding adhesive 13. The bonding adhesive 13 as heated is provided with fluidity and may be filled into the area between the adjacent bonding structures 111 and the through hole 111a of the bonding structure 111.

In step 804, pressure is applied to the flexible printed circuit and/or the display panel to enable the pin of the flexible printed circuit and the bonding structure of the display panel to be bonded by the bonding adhesive.

At the same time of irradiating the display panel with laser, the pressure may be applied to the flexible printed circuit and/or the display panel, such that the pin of the flexible printed circuit and the bonding structure of the display panel are bonded by the bonding adhesive.

Exemplarily, as shown in FIG. 16 and FIG. 18, at the same time of heating the bonding adhesive 13, pressure is applied to a side of the flexible printed circuit 12 distal from the display panel 11. The flexible printed circuit 12 and the display panel 11 extrude the bonding adhesive 13 to rupture the insulating layer of the conductive ball J of the bonding adhesive 13 and thereby expose the conductive ball core. Then, the bonding adhesive 13 is cured, such that the colloid matrix of the bonding adhesive 13 bonds the pins 121 of the flexible printed circuit 12 to the bonding structures 111 of the display panel 11. In addition, the conductive ball core of the bonding adhesive 13 conducts the pins 121 of the flexible printed circuit 12 and the bonding structures 111 of the display panel 11 in a one-to-one correspondence, thereby completing the bonding between the display panel 11 and the flexible printed circuit 12.

In summary, for the bonding method according to the embodiment of the present disclosure, the bonding structure of the display panel is provided with a through hole penetrating along the thickness direction of the bonding structure, and a bonding adhesive is provided between the display panel and the flexible printed circuit when the display panel is bonded to the flexible printed circuit. The display panel is irradiated from a side of the display panel distal from the base substrate with a laser, and the laser is capable of passing through the through hole of the bonding structure. Thus, the laser is capable of passing through the display panel via the area between the adjacent bonding structures and via the through hole on the bonding structure to heat the bonding adhesive, such that more laser is capable of being irradiated to the bonding adhesive, which helps to improve the heating efficiency of the laser to the bonding adhesive and thereby improve the bonding efficiency between the display panel and the flexible printed circuit. In addition, the area on the bonding adhesive between adjacent bonding structures and the area corresponding to the bonding structure can be directly heated by the laser, which helps to improve the heating uniformity of the bonding adhesive.

Based on the same inventive concept, the embodiment of the present disclosure further provides a display device. The display device may include a flexible printed circuit and the display panel according to the aforesaid embodiment, and the flexible printed circuit and the display panel are bonded by the bonding method according to the aforesaid embodiment.

Optionally, the display device may be an electroluminescence display device, and may be a flexible display device. For example, the display device may be an OLED display device or a quantum dot light-emitting diode (QLED) display device. The display device may be any product or component having a display function, such as a piece of electronic paper, a mobile phone, a tablet computer, a TV set, a display, a notebook computer, a digital photo frame, a navigator, a wearable device, or the like.

Those skilled in the art may easily understand that the sequence of steps of the manufacturing method according to the embodiments of the present disclosure can be appropriately adjusted, and the steps can also be correspondingly added or deleted according to the situation. For example, the method for manufacturing the display panel, after the step 707, may include a step of forming a flat layer, a passivation layer, and a pixel electrode. In addition, when the display panel is an LCD panel, the method may further include a step of manufacturing a color filter substrate; and when the display panel is an OLED display panel, the method may further include a step of forming a light-emitting layer, a cathode, a packaging structure, and a cover plate. Any method that can be easily conceived by any one skilled in the art within the technical scope disclosed in the present disclosure shall be contained within the protection scope of the present disclosure, and therefore will not be described again.

The term "and/or" in embodiments of the present disclosure merely describes the association relationship between the associated objects and indicates that there may be three relationships; for example, A and/or B may indicate three cases where only A exists, A and B exist at the same time, and only B exists. The term "at least one" indicates one or more in number, and "a plurality of" indicates two or more in number. The term "electrically connected" indicates a connection that is capable of transferring charge, but not necessarily includes charge transfer. For example, if A is electrically connected to B, it indicates that A is connected to B and charges can be transferred between A and B, whereas the charge transfer does not necessarily occur between A and B.

The foregoing descriptions are merely exemplary embodiments of the present disclosure, and are not intended to limit the present disclosure. Within the spirit and principles of the disclosure, any modifications, equivalent substitutions, improvements, etc., are within the protection scope of the present disclosure.

What is claimed is:

1. A display panel, being provided with a bonding area, the display panel comprising a bonding structure in the bonding area, wherein the bonding structure is provided with a through hole penetrating along a thickness direction of the bonding structure,
wherein the display panel further comprises: a base substrate and a reflecting structure disposed on the base substrate, and
wherein the bonding structure is disposed on a side of the reflecting structure distal from the base substrate, and the reflecting structure is provided with a through hole penetrating along a thickness direction of the reflecting structure, an orthographic projection of the through hole of the reflecting structure on the base substrate overlapping an orthographic projection of the through hole of the bonding structure on the base substrate.

2. The display panel according to claim 1, wherein the bonding structure is provided with a plurality of uniformly distributed through holes.

3. The display panel according to claim 2, wherein a ratio of a size of an opening surface of the through hole to a width of the bonding structure ranges from ⅓ to ½, and a hole pitch of any two adjacent through holes in the plurality of through holes ranges from 95 to 105 microns.

4. The display panel according to claim 1, wherein the opening surface of the through hole is in a circular or a polygonal shape.

5. The display panel according to claim 1, wherein the orthographic projection of the through hole of the bonding structure on the base substrate coincides with the orthographic projection of the through hole of the reflecting structure on the base substrate.

6. The display panel according to claim 1, further comprising:
an insulating layer disposed between the reflecting structure and the bonding structure, wherein the insulating layer is partially disposed in the through hole of the reflecting structure.

7. The display panel according to claim 1, wherein the reflecting structure comprises a gate trace; and the display panel further comprises a gate, a data line, and a source-drain pattern, wherein the gate and the reflecting structure are distributed in a same layer, and the bonding structure, the data line, and the source-drain pattern are distributed in a same layer.

8. The display panel according to claim 7, wherein the source-drain pattern comprises a source and a drain; and the display panel further comprises a buffer layer, an active layer, and a gate insulating layer that are sequentially distributed along a direction distal from the base substrate, wherein the active layer, the gate insulating layer, the gate, the source, and the drain constitute a thin film transistor.

9. The display panel according to claim 1, wherein the bonding structure is provided with a plurality of uniformly distributed through holes, wherein an opening surface of the through hole is in a circular or a polygonal shape, a ratio of a size of the opening surface of the through hole to a width of the bonding structure ranges from ⅓ to ½, and a hole pitch of any two adjacent through holes in the plurality of through holes ranges from 95 to 105 microns;
the display panel further comprises: an insulating layer disposed between the reflecting structure and the bonding structure, wherein the insulating layer is partially disposed in the through hole of the reflecting structure; and
the reflecting structure comprises a gate trace; and the display panel further comprises: a gate distributed in a same layer as the reflecting structure, a data line and a source-drain pattern that are distributed in a same layer as the bonding structure, and a buffer layer, an active layer and a gate insulating layer that are disposed between the base substrate and the gate along a direction distal from the base substrate, wherein the source-drain pattern comprises a source and a drain, and the active layer, the gate insulating layer, the gate, the source, and the drain constitute a thin film transistor.

10. A bonding method, comprising:
disposing a flexible printed circuit opposite to a display panel to enable a pin of the flexible printed circuit to be in one-to-one correspondence with a bonding structure of the display panel, wherein a bonding adhesive is provided between the pin and the bonding structure;

irradiating the display panel from a side of the display panel distal from the flexible printed circuit with a laser to enable the laser to pass through a through hole of the bonding structure to heat the bonding adhesive; and applying pressure to at least one of the flexible printed circuit and the display panel to enable the pin of the flexible printed circuit and the bonding structure of the display panel to be bonded by the bonding adhesive.

11. A method for manufacturing a display panel, comprising:

providing a base substrate provided with a bonding area;

forming a reflecting structure on the base substrate, wherein the reflecting structure is provided with a through hole penetrating along a thickness direction of the reflecting structure;

forming the bonding structure on a side of the reflecting structure in the bonding area distal from the base substrate, wherein the bonding structure is provided with a through hole penetrating along a thickness direction of the bonding structure, and an orthographic projection of the through hole of the bonding structure on the base substrate overlaps an orthographic projection of the through hole of the reflecting structure on the base substrate.

12. The method according to claim 11, wherein the bonding structure is provided with a plurality of uniformly distributed through holes.

13. The method according to claim 12, wherein a ratio of a size of an opening surface of the through hole to a width of the bonding structure ranges from ⅓ to ½, and a hole pitch of any two adjacent through holes in the plurality of through holes ranges from 95 to 105 microns.

14. The method according to claim 11, wherein prior to forming the bonding structure on the side of the reflecting structure in the bonding area distal from the base substrate, the method further comprises:

forming an insulating layer on the side of the reflecting structure distal from the base substrate, wherein the insulating layer is partially disposed in the through hole of the reflecting structure; and forming the bonding structure on the side of the reflecting structure in the bonding area distal from the base substrate comprises:

forming the bonding structure on a side of the insulating layer in the bonding area distal from the base substrate.

15. The method according to claim 14, wherein the reflecting structure comprises a gate trace, and the method further comprises:

forming a gate on the base substrate, wherein the gate and the reflecting structure are distributed in a same layer;

after forming the insulating layer on the side of the reflecting structure distal from the base substrate, the method further comprises:

forming a data line and a source-drain pattern on the side of the insulating layer distal from the base substrate, wherein the bonding structure, the data line, and the source-drain pattern are distributed in a same layer.

16. The method according to claim 15, wherein prior to forming the gate on the base substrate, the method further comprises:

sequentially forming a buffer layer, an active layer, and a gate insulating layer on the base substrate; and forming the gate on the base substrate comprises:

forming the gate on a side of the gate insulating layer distal from the base substrate.

17. A display device, comprising a flexible printed circuit and a display panel, wherein the flexible printed circuit and the display panel are bonded by the method as defined in claim 10.

18. A display device, comprising a flexible printed circuit and the display panel as defined in claim 1.

* * * * *